United States Patent [19]

Ichikawa

[11] Patent Number: 5,291,653
[45] Date of Patent: Mar. 8, 1994

[54] MANUFACTURING PRINTED WIRING BOARDS HAVING ELECTROMAGNETIC WAVE SHIELDING

[75] Inventor: Junichi Ichikawa, Saitama, Japan

[73] Assignee: Nippon CMK Corp., Japan

[21] Appl. No.: 869,659

[22] Filed: Apr. 16, 1992

[30] Foreign Application Priority Data

Sep. 30, 1991 [JP] Japan ................. 3-278345

[51] Int. Cl.$^5$ ............................... H05K 3/02
[52] U.S. Cl. ......................... 29/846; 29/830; 156/901; 156/902; 174/255; 174/256; 428/901
[58] Field of Search ............ 29/846, 830, 852; 156/901, 902; 174/255, 256, 258, 262, 266; 428/901

[56] References Cited

U.S. PATENT DOCUMENTS 4,440,823 4/1984 Hoffmann .............. 428/901 X
4,770,921 9/1988 Wacker et al. ......... 428/901 X

FOREIGN PATENT DOCUMENTS 2-98192 4/1990 Japan ................... 29/830

*Primary Examiner*—Carl J. Arbes
*Attorney, Agent, or Firm*—Bruce L. Adams; Van C. Wilks

[57] ABSTRACT

A method of manufacturing a printed wiring board comprises providing a substrate and forming a printed circuit having a ground circuit on the substrate. An insulating layer is formed on the substrate over the printed circuit and consists of two successively formed insulating layers having concentric circular apertures defining an opening above the ground circuit. The opening has a circular, stepped shape effective to facilitate the subsequent formation of an electromagnetic wave shielding layer. An electromagnetic wave shielding layer is formed by silk screening a conductive paste on the substrate over the insulating layer and through the opening and over the ground circuit.

7 Claims, 1 Drawing Sheet

MANUFACTURING PRINTED WIRING BOARDS HAVING ELECTROMAGNETIC WAVE SHIELDING

BACKGROUND OF THE INVENTION

The present invention is directed to a manufacturing method for printed wiring boards having electromagnetic wave shielding.

In order to prevent the malfunction of a circuit which may be caused by electromagnetic wave between the associated printed wiring circuits or between one printed wiring board and an external device, a printed wiring board is widely known having an electromagnetic shielding provided over the entire surface or local portion thereof through insulating layers.

Electrically conductive paste is usually applied on the printed wiring circuit through a silk screen by means of a printing method, and then cured to obtain the electromagnetic wave shielding layer.

Also, the electromagnetic wave shielding layer is electrically connected with the printed wiring circuit by way of a ground circuit of the printed wiring circuit, thereby accomplishing the electromagnetic wave shielding.

Referring now to FIG. 2 for further concrete illustration of the structure of the printed wiring boards described above, a desired printed wiring circuit 2 is formed on an electrically insulating substrate 1 by the conventional known method (for example, by etching copper foil of a copper-clad laminate), and then the electromagnetic wave shielding layer 6 is formed above the printed wiring circuit 2 through an insulating layer 3.

The electromagnetic wave layer 6 is electrically connected with a ground circuit 4 of the printed wiring circuit 2 through openings 4a defined by the insulating layer 3.

As particularly shown in FIG. 2, for the case where a multiplicity of connection areas 5 are densely formed between the electromagnetic wave shielding layer 6 and the printed wiring circuit 2, and for the case where the electromagnetic shielding layer 6 is formed by applying an electrically conductive paste through the silk screen, a conventional method uses an insulating layer composed of a plurality of layers so as to define the openings 4a whose section is of a cup shape, thereby ensuring an easy filling of the electrically conductive paste into the openings 4a.

As is clearly shown in FIG. 2, the insulating layer 3 includes a first, a second and a third insulating layers 3a, 3b and 3c which define stepwisely the opening 4a having toward the top a greater diameter, thereby imparting the configuration of a cup to the opening 4a.

In consequence, when the electrically conductive paste for the electromagnetic wave shielding layer 6 is applied through thus formed opening 4a, the electrically conductive paste can be smoothly filled into each of the openings 4a having a cup shape, thereby ensuring a secure connection between the electromagnetic wave shielding layer 6 and the printed wiring circuit 2 through each of the ground circuits 4.

However, in the conventional printed wiring board 11, at least three insulating layers are formed on the ground circuit 4 when densely forming a multiplicity of connection areas 5. This brings about a considerable unevenness between the insulating layer 3 and the ground circuit 4, and thickens the electrically conductive paste present in the connection area 5 of the ground circuit 4 at the time of forming the electromagnetic shielding layer 6.

The electrically conductive paste having the increased thickness is cured using the process of ED curing (electron radiation curing) which may produce an uncured portion depending on the curing time and irradiation amount. Moreover, the thickness of the electromagnetic wave shielding layer 6 is reduced due to the enlarged unevenness of the electromagnetic wave shielding layer 6 resting on the insulating layer 3, which may lead to problems decreasing the effectiveness of the electrical connection, safety of conductive resistance and the like.

When the printed wiring boards 11 delivered to users are subjected to heat during the soldering for mounting electrical components thereon, if the electrically conductive paste is made thicker, a thermal expansion during the soldering will cause distortion therebetween due to expansion and contraction of the individual materials, which may impair the adhesion properties of the electrically conductive paste.

Furthermore, with the greater film thickness, the components mounted on the connection area 5 extending along the end surface of the printed wiring board 11 are subjected to cracking due to the impact at the time of contour processing using a press, which may also lead to peeling.

DESCRIPTION OF THE PREFERRED EMBODIMENTS

An embodiment of the printed wiring board in accordance with the present invention will now be described with reference to the accompanying drawings.

Figure 1:
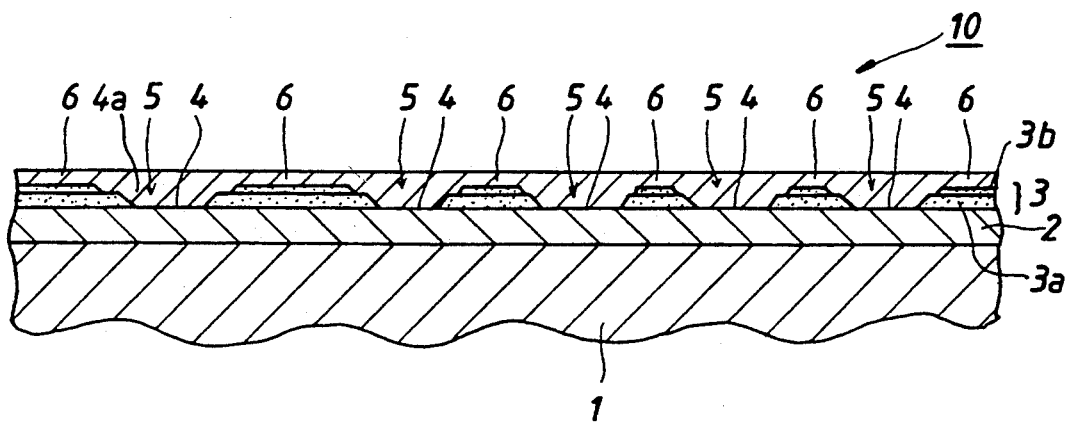
FIG. 1 is a sectional view of the principal part of the printed wiring boards embodying the present invention.
Figure 2:
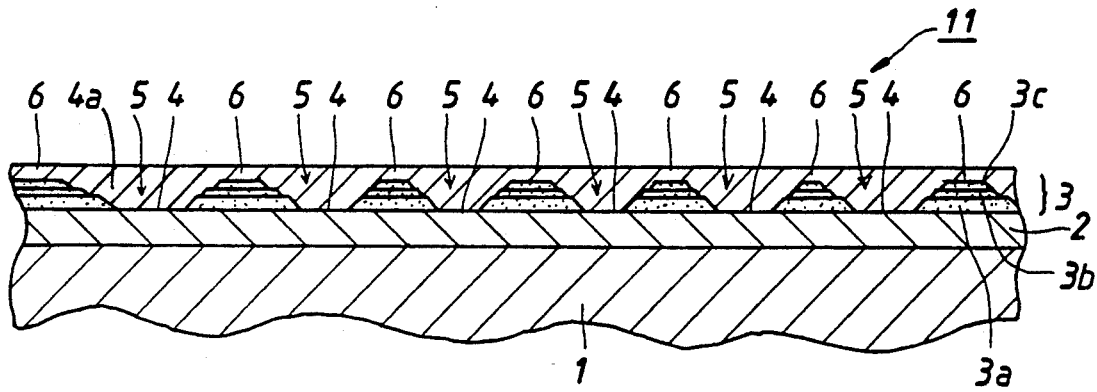
FIG. 2 is an explanatory drawing of the conventional printed wiring boards.

FIG. 1 is a sectional view of the essential part showing an embodiment of the printed wiring board according to the present invention.

In FIG. 1 a printed wiring board 10 comprises a substrate 1, a printed wiring circuit 2 formed on the substrate 1 and having a desired pattern, and an insulating layer 3 overlaid on the circuit 2.

Moreover, an electromagnetic wave shielding layer 6 is overlaid on the insulating layer 3 which is formed excluding a connection area 5 in contact with the electromagnetic wave shielding layer 6 of the printed wiring circuit 2. Through the connection area 5 the electromagnetic wave shielding layer 6 is electrically connected with an ground circuit 4 of the printed wiring circuit 2.

In order to ensure the electrical connection between the electromagnetic wave shielding layer 6 and the ground circuit 4 by way of the connection area 5, the shielding layer 6 is formed through an opening 4a in the region of the ground circuit 4, and an electrically conductive paste is filled into the opening 4a. The opening 4a which opens upward is defined by the insulating layer 3 consisting of a first and second insulating layer 3a, 3b, and has a configuration of a circle in top plan view and of a cup in section.

Accordingly, to provide the printed wiring board 10 with the electromagnetic wave shielding layer 6 having the above configuration, the opening 4a is smoothly and successively confined by the first insulating layer 3a and the second insulating layer 3b from the ground circuit 4 side in the given order in the region where the multiplicity of connection areas are densely formed, thereby lessening unevenness between the ground circuit 4 and the insulating layer 3 and making thinner the thickness of the electrically conductive paste present in the connection area 5. It is therefore possible to smoothly form the electromagnetic wave shielding layer 6 without the appearance of thin spots or air bubbles in the connection area 5.

According to the method of manufacturing printed wiring boards having electromagnetic wave shielding of the present invention, the number of formation of the insulating layers present only in the region where terminals are densely formed are reduced to lessen the unevenness between the ground circuit and the insulating layer and to thin the film thickness of the electrically conductive paste in the terminal regions. As a result, it becomes possible to prevent any uncured portion from being produced during the curing of the electrically conductive paste and to smoothly form the terminals without the appearance of thin spots or air bubbles, thereby realizing the production of the printed wiring boards having an electromagnetic wave shielding with a high accuracy.

What is claimed is:

1. A method of manufacturing a printed wiring board having electromagnetic wave shielding in which a printed wiring circuit made of an electrical conductor is provided on at least one side of a substrate, an electromagnetic wave shielding layer is provided over the entire surface or a desired portion of the printed wiring circuit through an insulating layer, and the printed wiring circuit is electrically connected with the electromagnetic wave shielding layer by way of a ground circuit of the printed wiring circuit, the insulating layer consisting of a plurality of electrically insulating layers, and the insulating layers defining above the ground circuit an opening having a configuration of a cup in section, the improvement comprising:

form first and second insulating layers one atop the other each constituting part of said insulating layer so as to form said opening defined above the ground circuit having a configuration of a circle as viewed in top plan view.

2. A method of manufacturing a printed wiring board, comprising the steps: providing a substrate; forming a printed circuit having at least one ground circuit on at least one side of the substrate; successively forming only two insulating layers, one atop the other, on the substrate over the printed circuit, the two insulating layers jointly defining an opening above each ground circuit, each opening having a stepped, circular shape as viewed in top plan view to facilitate the subsequent formation of an electromagnetic wave shielding layer; and forming an electromagnetic wave shielding layer on the substrate and over the two insulating layers and through each opening and over each ground circuit which underlies each opening.

3. A method of manufacturing a printed circuit board according to claim 2; wherein the step of forming the printed circuit includes forming the printed circuit on both sides of the substrate.

4. A method of manufacturing a printed circuit board according to claim 2; wherein the step of forming the electromagnetic wave shielding layer is carried out by silk screening a conductive paste over the two insulating layers and through each opening.

5. A method of manufacturing a printed circuit board according to claim 2; wherein each circular opening in the first formed insulating layer has a diameter smaller than that of the overlying circular opening in the second formed insulating layer.

6. A method of manufacturing a printed wiring board, comprising the steps: providing a substrate; forming a printed circuit having at least one ground circuit on at least one side of the substrate; successively forming only two insulating layers, one atop the other, on the substrate and over the printed circuit to define concentric circular apertures extending through the two insulating layers at locations above each ground circuit, each circular aperture in the first-formed insulating layer having a diameter smaller than that of the overlying circular aperture in the second-formed insulating layer to form an opening above each grounding circuit, each opening having a stepped, circular shape as viewed in top plan view to facilitate the subsequent formation of an electromagnetic wave shielding layer; and forming an electromagnetic wave shielding layer by silk screening a conductive paste on the substrate and over the insulating layer and through each opening and over each ground circuit which underlies each opening.

7. A method of manufacturing a printed circuit board according to claim 6; wherein the step of forming the printed circuit includes forming the printed circuit on both sides of the substrate.

* * * * *